United States Patent
Huster et al.

(12)

(10) Patent No.: US 6,518,072 B1
(45) Date of Patent: Feb. 11, 2003

(54) DEPOSITED SCREEN OXIDE FOR REDUCING GATE EDGE LIFTING

(75) Inventors: Carl Robert Huster, San Jose, CA (US); Daniel Sobek, Portola Valley, CA (US); Timothy Thurgate, Sunnyvale, CA (US); Sameer S. Haddad, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/476,906

(22) Filed: Jan. 3, 2000

Related U.S. Application Data

(60) Provisional application No. 60/163,760, filed on Nov. 5, 1999.

(51) Int. Cl.[7] .......................................... H01L 21/8247
(52) U.S. Cl. ......................... 438/4; 438/261; 438/264; 438/595
(58) Field of Search ....................... 438/4, 257, 261, 438/264, 594, 595

(56) References Cited

U.S. PATENT DOCUMENTS

| | | | | |
|---|---|---|---|---|
| 5,352,618 A | * | 10/1994 | Larsen et al. | 438/264 |
| 5,963,806 A | * | 10/1999 | Sung et al. | 438/266 |
| 6,103,576 A | * | 8/2000 | Deustcher et al. | 438/261 |
| 6,221,708 B1 | * | 4/2001 | Gonzalez et al. | 438/261 |

OTHER PUBLICATIONS

Wolf, "Silicon Processing for the VLSI Era", vol. 2, pp. 643–647, 1990.*

* cited by examiner

*Primary Examiner*—Chandra Chaudhari

(57) ABSTRACT

A method of manufacturing a flash memory device with a controllable amount of gate edge lifting including etching the ends of the tunnel oxide forming a cavity at each end of the tunnel oxide and anisotropically depositing and etching an oxide to form spacers on the sides of the gate stack. The spacers have a predetermined thickness that controls the amount of gate edge lifting. The predetermined thickness is determined during a characterization procedure that can be a computer modeling procedure or it can be determined empirically.

7 Claims, 7 Drawing Sheets

US 6,518,072 B1

DEPOSITED SCREEN OXIDE FOR REDUCING GATE EDGE LIFTING

This application claims benefit of provisional application 60/163,760 filed Nov. 5, 1999.

BACKGROUND OF THE INVENTION

1. Field of the Invention

This invention relates generally to floating gate semiconductor memory devices such as EEPROMs. More specifically, this invention relates to methods of manufacturing floating gate semiconductor memory devices such as EEPROMs. Even more specifically, this invention relates to methods of manufacturing floating gate semiconductor memory devices such as EEPROMs that reduce the amount of gate-edge lifting.

2. Discussion of the Related Art

A class of non-volatile memory devices known as "flash" EEPROM (Electrically Erasable Programmable Read Only Memory) devices combines the advantages of EPROM density with the electrical erasability of an EEPROM. One feature that distinguishes flash EEPROM memory cells from standard EEPROM memory cells is that unlike standard EEPROM memory cells, flash EEPROM memory cells do not contain a select transistor on a one-for-one basis with each floating gate memory cell. A select transistor is a transistor that allows the selection of an individual memory cell within the memory device and is used to selectively erase a specific memory cell. Because flash EEPROMs do not have a select transistor for each floating gate transistor, flash EEPROM memory cells cannot be individually erased and therefore must be erased in bulk, either by erasing the entire chip or by erasing paged groups or banks of cells. Elimination of the select transistor allows for smaller cell size and gives the flash EEPROM an advantage in terms of manufacturing yield (in terms of memory capacity) over comparably sized standard EEPROMs.

Typically, a plurality of flash EEPROM cells is formed on a semiconductor substrate, which is also known as a silicon wafer. FIG. 1 illustrates a single conventional flash EEPROM memory cell having a double-diffused source region. As shown in FIG. 1, flash memory cell 100 is formed on a p-type substrate 110 and includes an n type double-diffused source region 102 and an n+drain region 104. The drain region 104 and the source region 102 are spaced apart from each other forming a channel region 122. A source electrode 114 and a drain electrode 112 are connected to the source region 102 and the drain region 104, respectively.

The double-diffused source region 102 is formed of a lightly doped n region 128 (phosphorous doped) and a more heavily doped but shallower n+region 130 (arsenic doped) embedded within the deep n region 128. The phosphorus doping within n region 128 reduces the horizontal electric field between the source region 102 and the substrate 110.

The floating gate 106 is disposed a short distance above the source region 102, the drain region 104 and the channel region 122 over a dielectric layer 118, which is also known as a tunnel oxide region. Above the floating gate 106 and disposed over the dielectric layer 116 is a control gate 108. The dielectric layer 116 is typically formed of an oxide/nitride/oxide layer known in the semiconductor manufacturing art as an ONO layer. A control gate electrode 120 is attached to control gate 108. The dimension $L_{GATE}$ 132 represents the gate length for the gates contained in flash memory cell 100.

In a conventional method of operation, the programming of a flash EEPROM memory cell is achieved by inducing "hot electron" injection from a section of the channel 122 near the drain 104 into the floating gate 106. The injected electrons cause the floating gate 106 to carry a negative charge. Grounding the source region 102, biasing the control gate 108 to a relatively high positive voltage and biasing the drain region 104 to a moderate positive voltage induce the hot electrons.

For example, to program the flash memory cell 100, the source electrode 114 is connected to ground, the drain electrode 112 is connected to a relatively high voltage (typically +4 volts to +9 volts) and the control gate electrode 120 is connected to a relatively high voltage level (typically +8 volts to +12 volts). Electrons are accelerated from source region 102 to drain region 104 via the channel 122 via the channel 122 and the "hot electrons" are generated near the drain region 104. Some of the hot electrons are injected through the relatively thin gate dielectric layer 118 and become trapped in the floating gate 106 thereby giving floating gate 106 a negatively potential.

After sufficient negative charge accumulates on floating gate 106, the negative potential of floating gate 106 raises the threshold voltage of the stacked gate transistor and inhibits current flow through the channel 122 during a subsequent "read" mode. The magnitude of the read current is used to determine whether a memory cell has been programmed.

Conversely, to erase a flash memory device, electrons are typically driven out of the floating gate 106 by biasing the control gate 108 to a large negative voltage and biasing the source region 102 to a low positive voltage in order to produce a sufficiently large vertical electric field in the tunnel oxide. The large vertical field 136 in the tunnel oxide produces Fowler-Nordheim (F-N) tunneling of electrons stored in the floating gate 106 through the tunnel oxide into the source region 102. Arrows 105 indicate the tunneling of the electrons from the floating gate 106 to the source region 102. The charge removed from the floating gate 106 produces a threshold voltage shift.

For example, during erasure a relatively low positive voltage (typically from +0.5 volts to +5 volts) is applied to source electrode 114 and a relatively large negative voltage (typically from −7 volts to −13 volts) is applied to control gate electrode 120. The voltage of the substrate electrode 126 is grounded and the drain electrode 112 is allowed to float. The vertical electric field established between the control gate 108 and the source region 102 induces electrons previously stored in floating gate 106 to pass through dielectric layer 118 and into source region 102 by way of Fowler-Nordheim tunneling.

In order to produce a sufficient electric field in the tunnel oxide, it is typically necessary to bias the control gate 108 to a large enough negative voltage such that the floating gate 106 reaches a voltage of approximately −5.5 volts. A typical potential difference $V_{SF}$ between the source region 102 and floating gate 106 is on the order of 10 volts and accordingly, when the source voltage $V_S$ is made less positive, the control gate voltage $V_{CG}$ should be made more negative. Once the source to floating voltage $V_{SF}$ is selected, the remaining factors are preferably constrained according to the equation:

$$V_{FG} = \alpha_{CG}(V_{CG} - \Delta V_T) + \alpha_S V_S + \alpha_B V_B$$

where:

$V_{FG}$=the floating gate voltage;

$V_{CG}$=the control gate voltage;

$V_s$=the source voltage;

$V_B$=the substrate or p-well bias;

$\Delta V_T$=the threshold voltage difference arising from negative charge added to the floating gate as measured from the control gate;

$\alpha_{CG}$=the capacitive coupling coefficient from the control gate to the floating gate;

$\alpha_S$=the capacitive coupling coefficient between the source and the floating gate;

$\alpha_B$=the capacitive coupling coefficient between the substrate or p-well and the floating gate.

As technology advances, a continuing goal throughout the industry is to increase the density of memory devices. By reducing the size of a flash EEPROM device a greater memory capacity can be achieved. As can be appreciated, the more die per wafer, the cost per die can be reduced. In addition, using higher density memory devices may provide for a reduction in the overall power consumption.

In order to increase the memory density of flash EEPROM devices, the memory cells are typically scaled down in size, for example the reduction in overall footprint of the device, is accomplished by reducing the gate length ($L_{GATE}$) 132. However, a problem with reducing the length of the memory cell gates is that the distance $L_{CHANNEL}$ 122 between the source region 102 and the drain region 104 must also be reduced. As the source region 102 approaches the drain region 104, the lateral diffusion from the phosphorous in the source region 128 causes a leakage between the source region 102 and the drain region 104 resulting in detrimental short channel effects. Short channel effects produce serious problems in the flash memory cells and are typically evident when the gate length ($L_{GATE}$) 132 is reduced below 0.4 microns.

One method for reducing the short-channel effect would be to eliminate the double-diffused phosphorous region 128. By using a single-diffused source region, the phosphorous diffusion overlap distance $L_{DD}$ 124 would no longer present and the short channel effect problem would be significantly reduced. Eliminating the phosphorous diffusion overlap distance $L_{DD}$ 124 would allow for a gate length ($L_{GATE}$) reduction below 0.4 microns and would provide for an increased packing density of the memory cells.

However, eliminating the phosphorous doped N region 128 produces the unwanted side effect of increasing the horizontal electric field $E_H$ in the pn junction between the source region 102 and the substrate 110 during erasure of the memory cell. This increase in the horizontal electric field $E_H$ contributes to an increase in the band-to-band current since it is generally accepted that:

$$J_{b-t-b}=A_{b-t-b}f(E)e^{-(B_{b-t-b}/E)}$$

where:

$J_{b-t-b}$=band-to-band current density (amps/cm$^2$)

$A_{b-t-b}$,$B_{b-t-b}$=constants f(E) sometimes modeled as $E^2$

E=SQRT ($E_V^2+E_H^2$) (the tunneling field in the junction).

Because of the source-to-substrate biasing during the erasure of the memory cell device, a reversed-biased pn junction is formed that produces band-to-band currents (also known as Zener currents) in the source junction. The band-to-band currents are normally several orders of magnitude larger than the Fowler-Nordheim current. This band-to-band current is hard to sustain from a circuit design point of view and is also believed to generate detrimental reliability problems such as hole trapping in the tunnel oxide.

One barrier to further decrease the size of flash memory cells is that during manufacture of the flash memory cells, there is a phenomenon called gate-edge lifting that occurs during an oxidation procedure. Gate-edge lifting causes the tunnel oxide to thicken at each end and is a particular problem at the source end of the tunnel oxide through which the electrons must tunnel during Fowler-Nordheim erasure. Because the gate-edge lifting is not the same for each memory cell, the erase characteristics of each memory cell may differ and as a result the erase procedure has to be extended to ensure that all memory cells are erased. In addition, in order for each memory cell to be erased at the lowest possible voltage the source region has to be extended under the gate region until the heavily doped region of the double diffused source region reaches a region under the tunnel oxide that has not been thickened. This helps improve the uniformity of cell erase characteristics. However, the extension of the source region under the gate until the heavily doped region reaches a non-thickened portion under the tunnel region prevents the memory cell from being shortened.

Therefore, what is needed is a method of manufacturing flash memory cells that decreases the amount of gate-edge lifting so that the distance the source needs to extend under the gate is decreased allowing the memory cell to be shortened.

SUMMARY OF THE INVENTION

According to the present invention, the foregoing and other objects and advantages are achieved by a method of manufacturing a flash memory cell with a predetermined amount of gate edge lifting.

In an aspect of the invention, a gate stack is formed on a substrate wherein the gate stack comprises a layer of tunnel oxide, a floating gate, a layer of ONO and a control gate. The ends of the layer of tunnel oxide are etched forming cavities between the substrate and floating gate at the ends of the layer of tunnel oxide. A layer of oxide is deposited and anisotropically etched to form spacers on the sides of the gate stack wherein the cavities are also filled with the deposited oxide. The spacers have a predetermined thickness that controls the amount of gate edge lifting.

In another aspect of the invention, the predetermined thickness is determined during a characterization procedure.

In another aspect of the invention, the characterization procedure is determined either by computer modeling procedure and an empirical method.

In another aspect of the invention, phosphorus and arsenic ions are implanted into the substrate to form a double diffused source region and a drain region.

In another aspect of the invention, a second anneal process drives the implanted phosphorus and arsenic ions into the substrate.

In another aspect of the invention, as second anneal process drives the implanted phosphorus and arsenic ions into the substrate.

The described method of manufacturing a flash memory cell thus provides a flash memory cell with a predetermined amount of gate edge lifting.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 2A shows a portion of a flash memory device including a substrate, a layer of tunnel oxide formed on the substrate and a "gate stack" formed on the layer of tunnel oxide comprising a floating gate, a layer of ONO and a control gate;

FIG. 2B shows the portion of the flash memory device as shown in FIG. 2A after an oxidation process to form a thin layer of oxide on the gate stack to protect the gate stack from a subsequent ion implantation process;

FIG. 2C shows the portion of the flash memory device as shown in FIG. 2B undergoing an ion implantation to form source and drain regions;

FIG. 2D shows the portion of the flash memory device as shown in FIG. 2C after an anneal process to drive the implanted ions into the substrate to form the source and drain regions;

FIG. 3A shows a portion of a flash memory device including a substrate, a layer of tunnel oxide formed on the substrate and a "gate stack" formed on the layer of tunnel oxide comprising a floating gate, a layer of ONO and a control gate;

FIG. 3B shows the portion to the flash memory device as shown in FIG. 3A after a hydrogen fluoride cleaning process that etches the layer of tunnel oxide under the floating gate;

FIG. 3C shows the portion of the flash memory device as shown in FIG. 3B after a layer of oxide has been deposited on the surface of the flash memory device;

FIG. 3D shows the portion of the flash memory device as shown in FIG. 3C undergoing an anneal procedure;

FIG. 3E shows the portion of the flash memory device as shown in FIG. 3D being implanted with phosphorus ions to form the phosphorus implanted region of the double diffused source;

FIG. 3F shows the portion of the flash memory device as shown in FIG. 3E being implanted with arsenic ions to form the arsenic implanted region of the double diffused source and the drain region; and FIG. 3G shows the portion of the flash memory device as shown in FIG. 3F undergoing an anneal process to drive the implanted ions into the substrate and to repair damage caused by the implantation process.

DETAILED DESCRIPTION

Reference is now made in detail to specific embodiments of the present invention, which illustrate the best mode presently contemplated by the inventors for practicing the invention.

Figure 1:
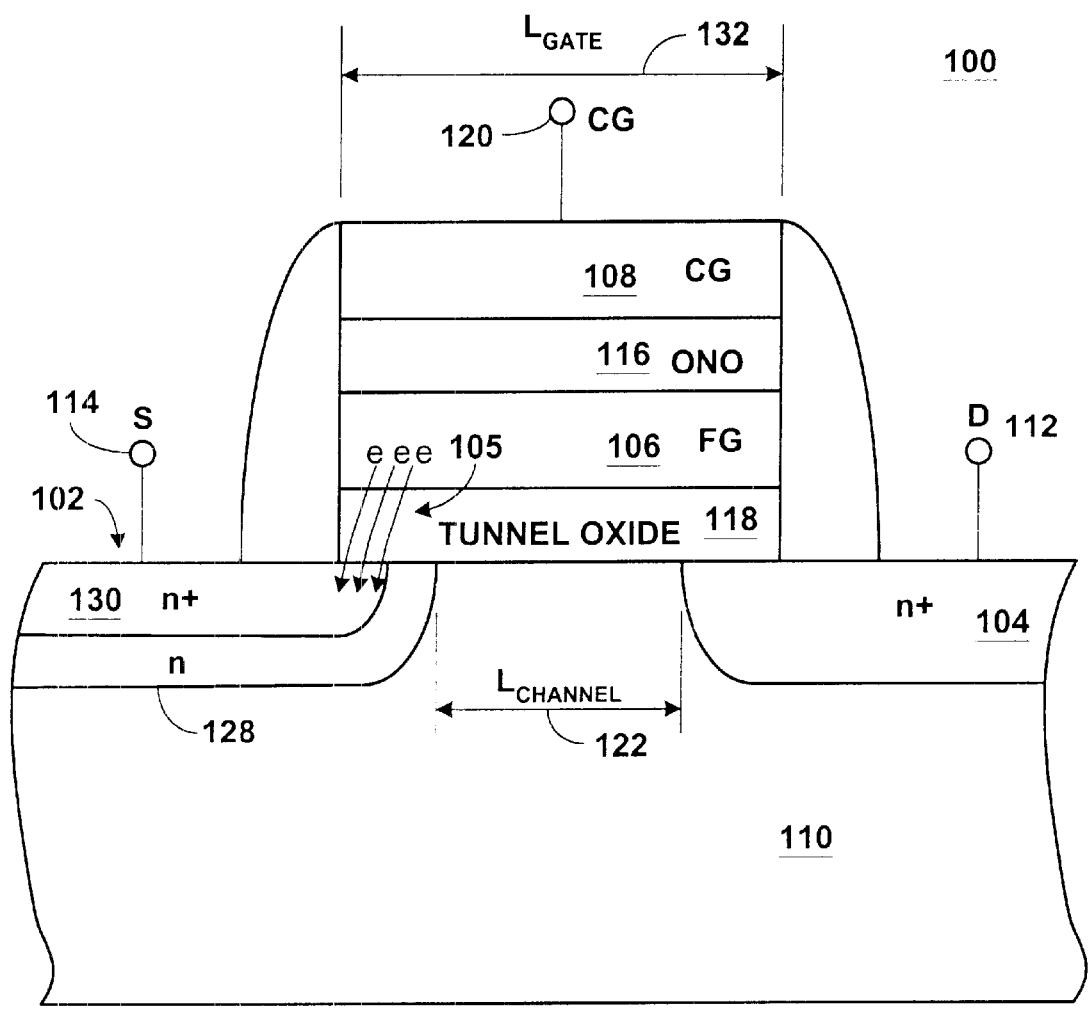
FIG. 1 shows the structure of a typical flash memory cell.
Figure 2A:
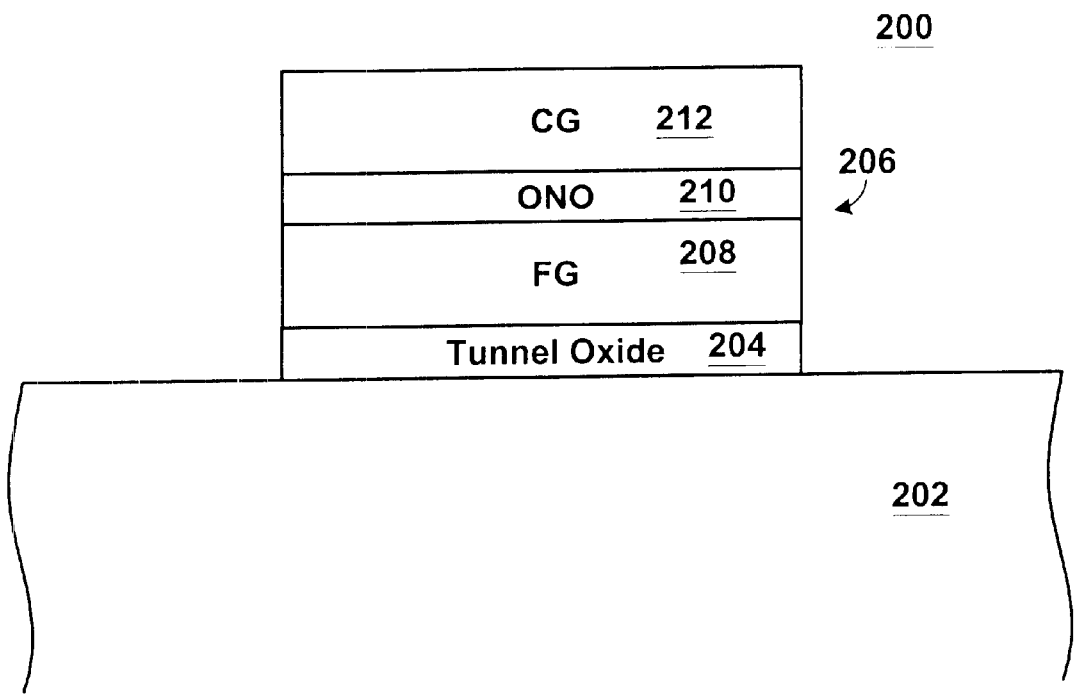
FIGS. 2A–2D illustrate a portion of a prior art process for the manufacture of flash memory devices.

FIGS. 2A–2D illustrate a portion of a prior art process for the manufacture of flash memory devices. FIG. 2A shows a portion 200 of a flash memory cell that includes a substrate 202 with a layer 204 of tunnel oxide formed on the surface of the substrate 202. A structure 206 known as a gate stack is formed on the layer 204 of tunnel oxide. As is known in the semiconductor manufacturing art, the gate stack 206 structure is formed by forming a layer of polysilicon that will be the floating gate 208, layer 210 of ONO, which is a thin layer of silicon oxide, a thin layer of silicon nitride, and a thin layer of silicon oxide, and a layer of polysilicon that will be the control gate 212. After the layers of the various materials are formed, an etch process forms the gate stack as shown in FIG. 2A.

Figure 2B:
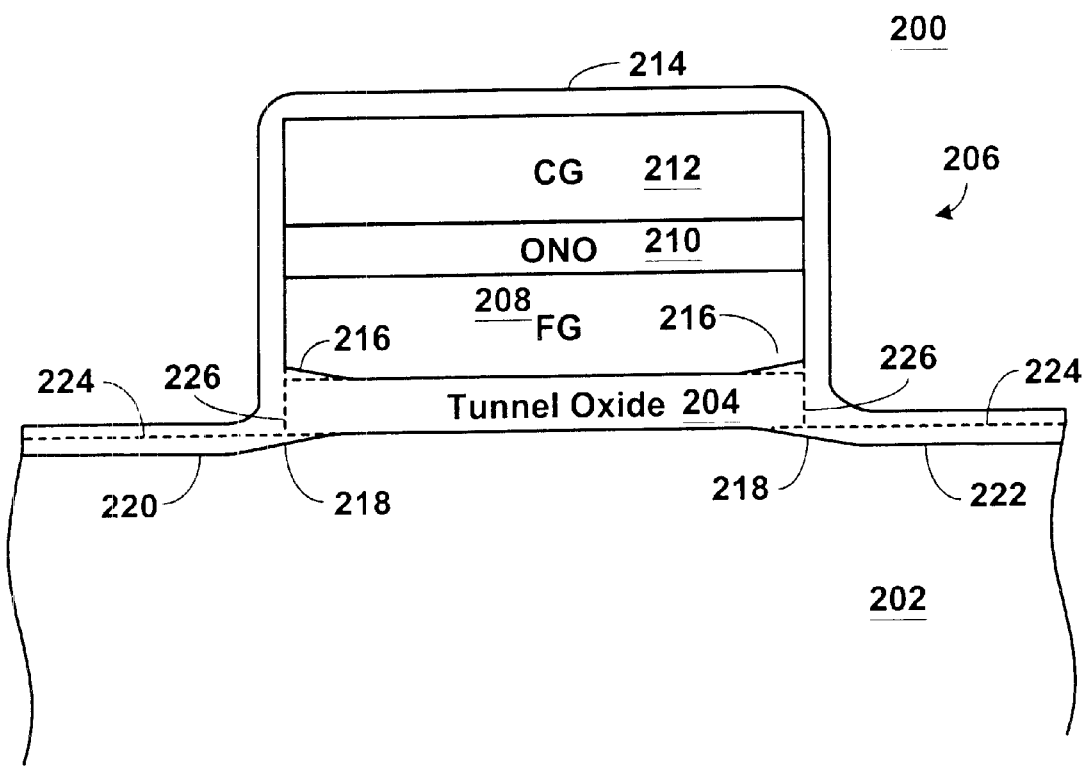

FIG. 2B shows the portion 200 of the flash memory device as shown in FIG. 2A after an oxidation process that serves to form a protective layer 214 of oxide on the gate stack to specifically protect the exposed ends of the polysilicon material that will form the floating gate 208 and the control gate 212 by forming the thin layer of oxide 214 that forms on exposed silicon surfaces. However, the oxidation process causes gate edge lifting as shown at 216 and causes oxide to form underneath a portion of the layer 204 of tunnel oxide as indicated at 218. As is known in the art of semiconductor manufacturing, the substrate, which is formed from lightly doped silicon will oxidize as shown by the solid lines 220 and 222. The dashed lines 224 show the original outline of the silicon substrate 202. The dashed lines 226 show the original outline of the tunnel oxide 204.

Figure 2C:
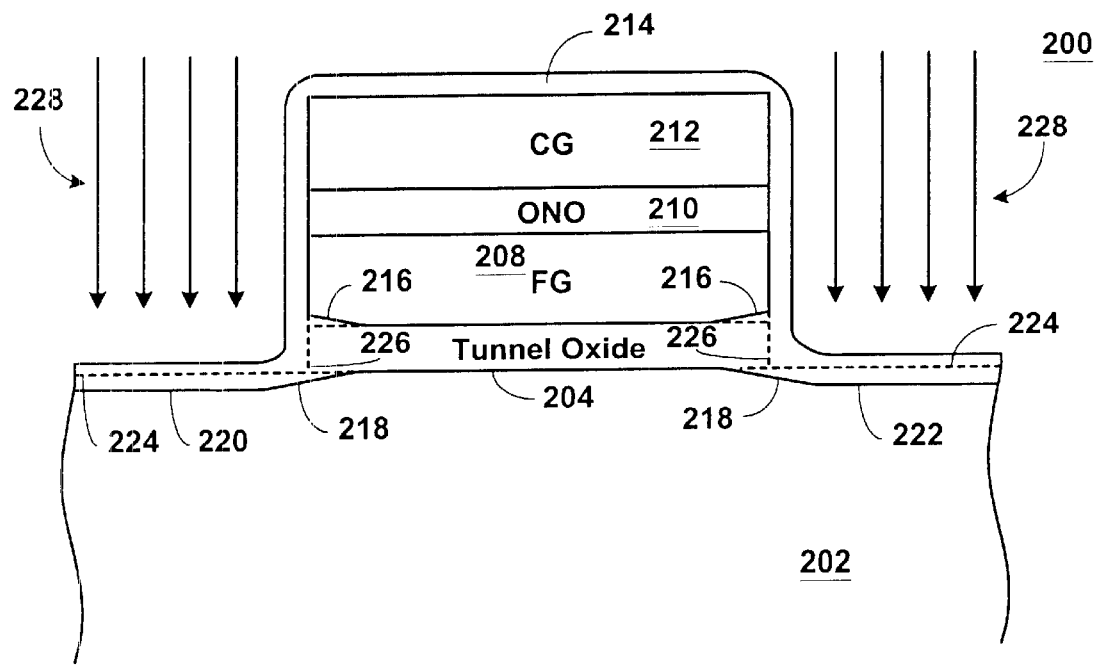

FIG. 2C shows the portion 200 of the flash memory device as shown in FIG. 2B with arrows 228 representing various ion implantations into the substrate 202 that will form the double diffused source region and the drain region. As is known in the semiconductor manufacturing art, there may be more than one ion implantation to implant phosphorus ions in the substrate to form the n region of the double diffused source region and another ion implantation to implant arsenic ions into the substrate to form the n+region of the double diffused source region and the drain region of the flash memory device.

Figure 2D:
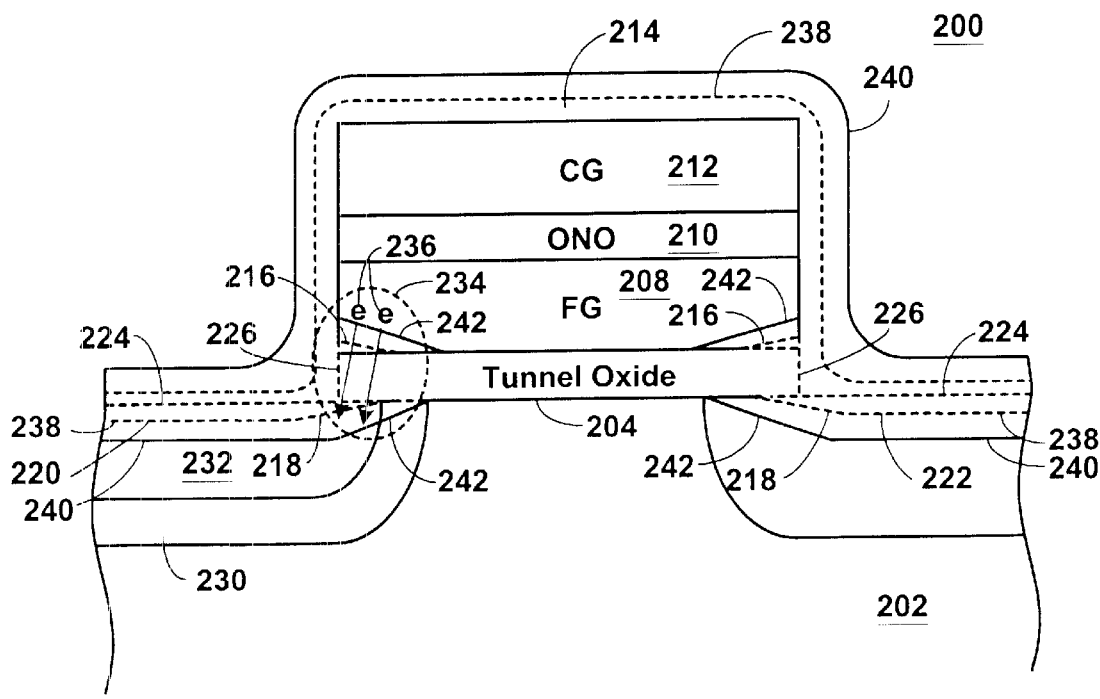

FIG. 2D shows the portion 200 of the flash memory device as shown in FIG. 2C after an anneal process to drive the phosphorus and arsenic ions into the substrate 202 to form the phosphorus implanted source region 230 and the arsenic implanted source region 232. The anneal process causes further oxidation, which causes the layer of oxide to increase in thickness. The anneal process is an oxidizing process in order to repair the damage done during the implantation of dopant ions. This oxidation causes increased gate edge lifting because the oxidation is enhanced by the high impurity concentration of dopants from the implantations. The dashed line 238 indicates the original thickness of the oxide layer 214 resulting from the first oxidation and the line 240 indicates the outline of the increased thickness of the layer of oxide. The anneal process also causes increased gate edge lifting as indicated at 242. As is known in the semiconductor manufacturing art, phosphorus ions migrate more readily than arsenic ions and a single anneal in a region that contain both phosphorus ions and arsenic ions can result in a double diffused region as shown by regions 230 and 232. As shown within circle 234, the tunnel oxide at the source end has been thickened in the region at which the electrons indicated at 236 must tunnel from the floating gate 204 to the source region 232 across the tunnel oxide 204 during the Fowler-Nordheim erase procedure. As known in the flash memory art, the electrons tunnel across the tunnel oxide 204 to the portion of the double diffused source region that has arsenic ions implanted. As discussed above, the electrons have to tunnel through a thicker tunnel oxide, which as also discussed above, may vary from memory cell to memory cell and may cause each memory cell to have differing erase characteristics. In addition, because the electrons tunnel to the arsenic implanted portion of the double diffused source region, the phosphorus implanted region of the double diffused source region must be driven further under the tunnel oxide and to maintain the minimum required channel length the size of the memory cell cannot be decreased. Therefore, it should be obvious that a process that does not include the second anneal/oxidation process would allow shorter memory cells and less gate edge lifting.

Figure 3A:
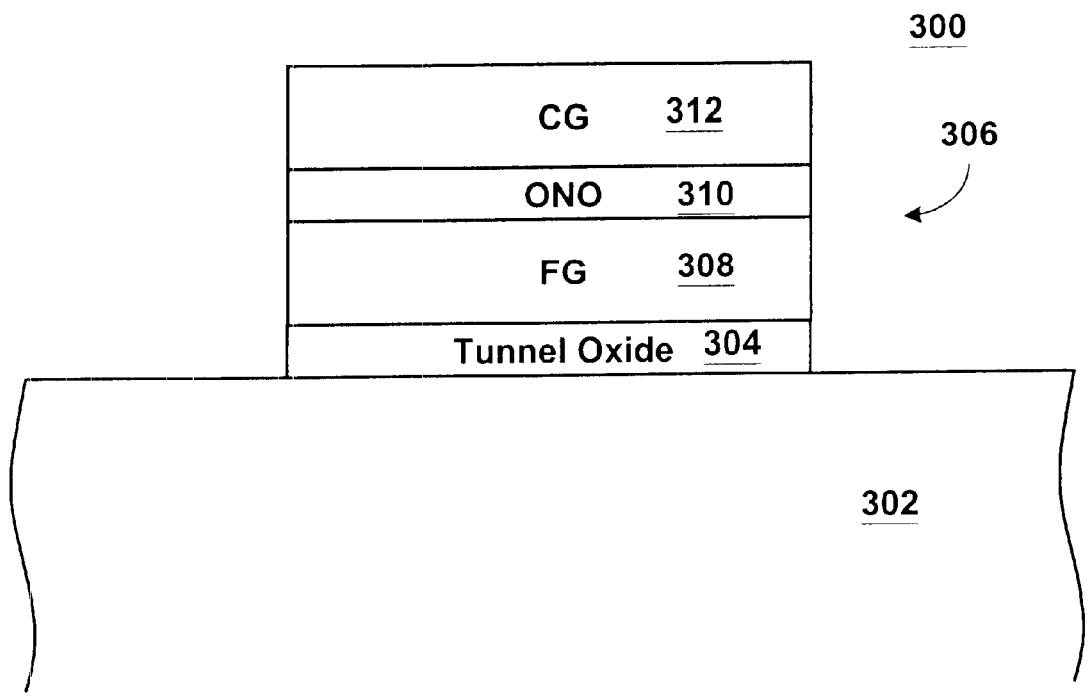
FIGS. 3A–3G illustrate a portion of a process for the manufacture of flash memory devices in accordance with the present invention.

FIGS. 3A–3G illustrate a portion of a process for the manufacture of flash memory devices in accordance with the present invention. FIG. 3A shows a portion 300 of a flash memory device that includes a substrate 302 with a layer 304 of tunnel oxide formed on the surface of the substrate 302. A structure 306 known as a gate stack is formed on the layer 304 of tunnel oxide. As is known in the semiconductor manufacturing art, the gate stack 306 structure is formed by forming a layer of polysilicon that will be the floating gate 308, layer 310 of ONO, which is a thin layer of silicon oxide, a thin layer of silicon nitride, and a thin layer of silicon oxide, and a layer of polysilicon that will be the control gate 312. After the layers of the various materials are formed, an etch process forms the gate stack as shown in FIG. 3A.

Figure 3B:
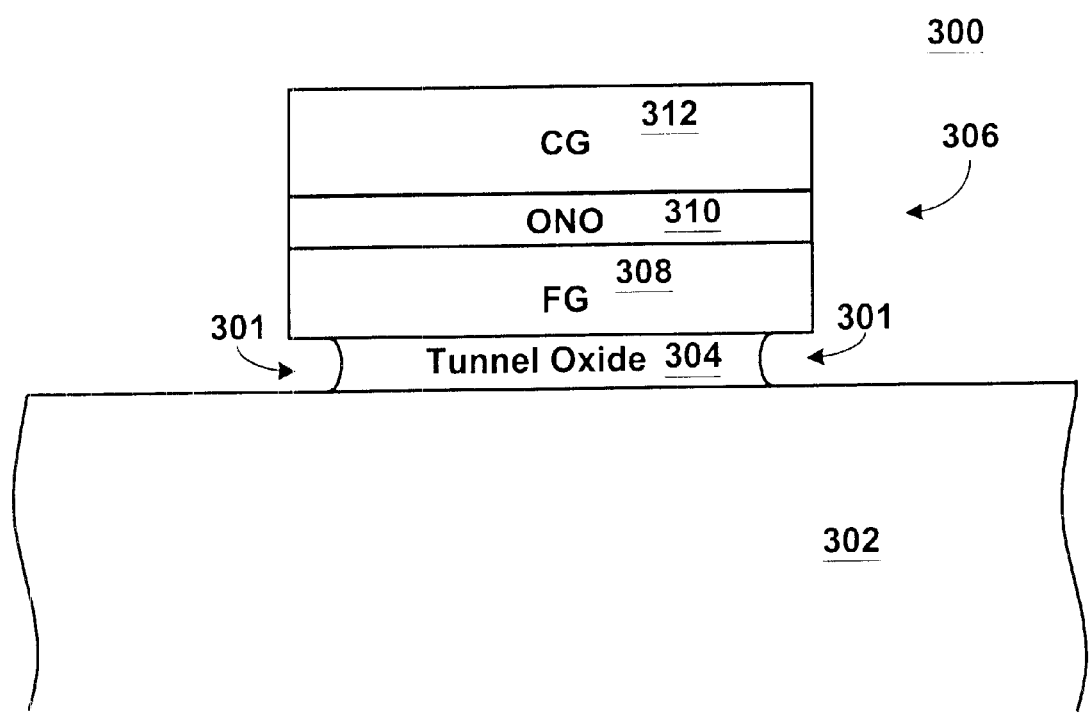

FIG. 3B shows the portion 300 of the flash memory device as shown in FIG. 3A after a process that removes portions 301 of the layer 304 of tunnel oxide from between the floating gate 308 and substrate 302. The process that removes the portions 301 of the layer 304 of tunnel oxide from between the floating gate 308 and substrate 302 can be a process such as a hydrogen fluoride cleaning process or other isotropic etch process suitable for etching oxide.

Figure 3C:
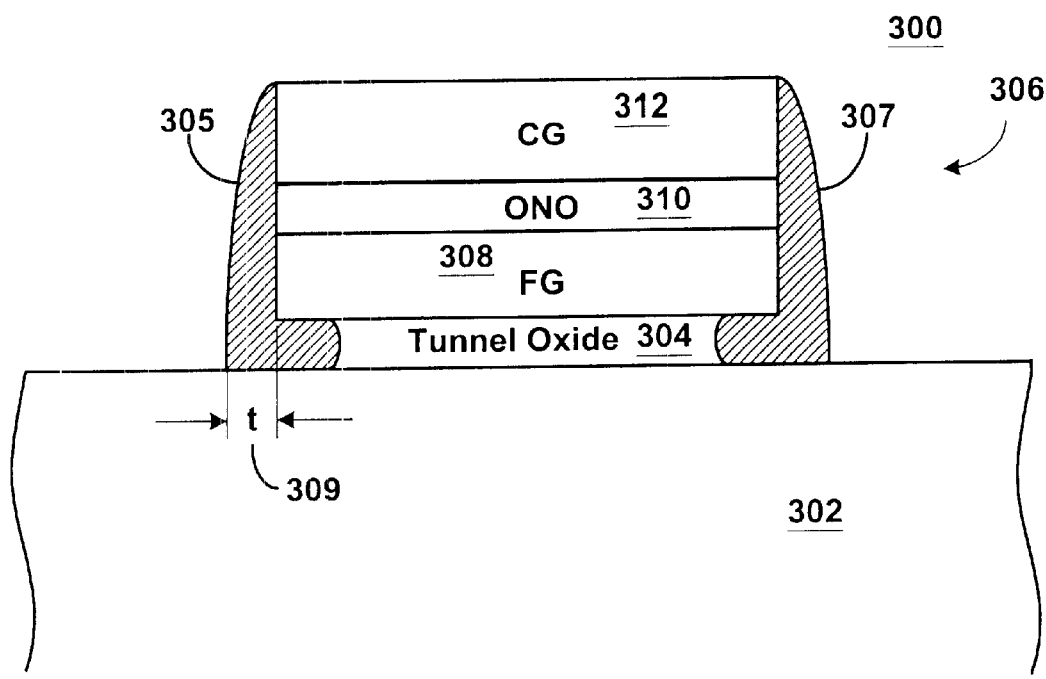

FIG. 3C shows the portion 300 of the flash memory device as shown in FIG. 3B after a process of anisotropically depositing oxide on the flash memory device and etching the oxide to form spacers 305 and 307 as shown in FIG. 3C. The thickness t of the spacers, indicated at 309 is controlled to achieve a desired amount of gate-edge lifting that will occur in subsequent processes. The greater the thickness t, the less gate-edge lifting occurs. It has been determined that some gate-edge lifting is advantageous to prolong the life of the device. The amount of gate-edge lifting and thus the thickness t is predetermined in a characterization procedure either by computer modeling or empirically.

Figure 3D:
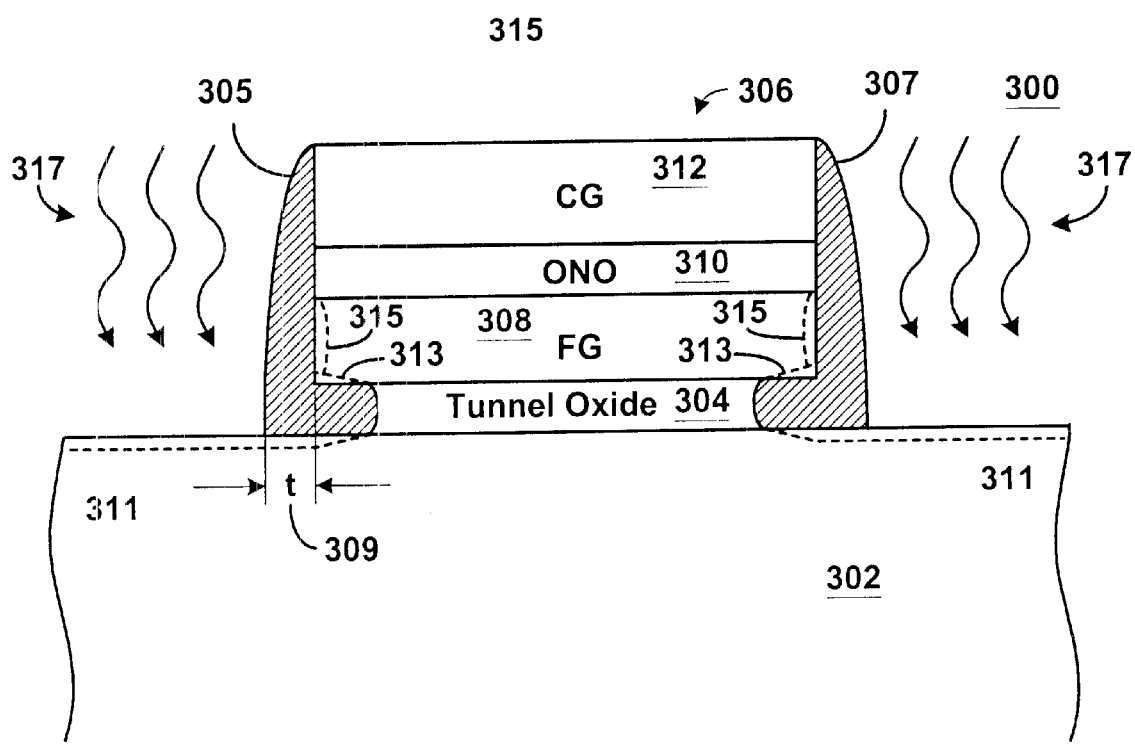

FIG. 3D shows the portion 300 of the flash memory device as shown in FIG. 3C undergoing an anneal procedure, indicated by the wavy arrows 317, the purpose of which is to improve the quality of the spacers 305 and 307. The anneal process "cleans" up the interface between the oxide and the flash memory device and densities the oxide. During the anneal process there is a modest oxide growth as shown by dashed lines 311 and there is a modest amount of gate edge-edge lifting as shown by dashed lines 313. There is also a small amount of oxide growth at the ends of the floating gate 308 as shown by dashed lines 315.

Figure 3E:
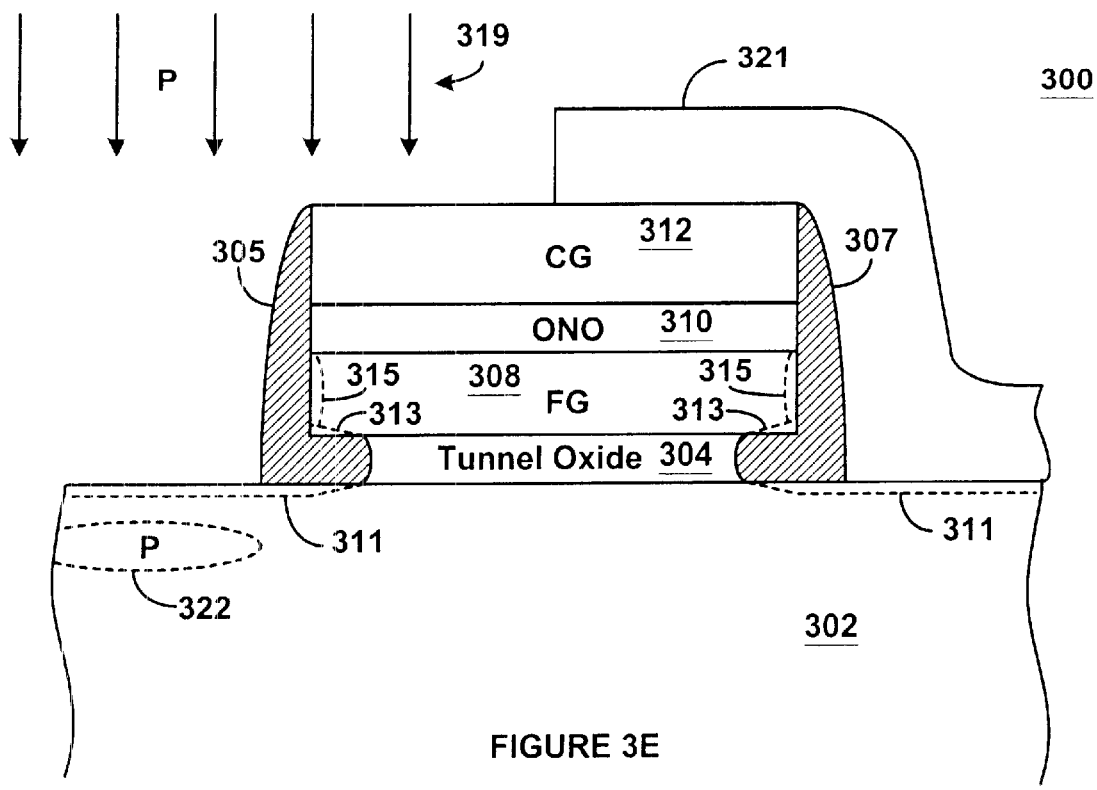
Figure 3F:
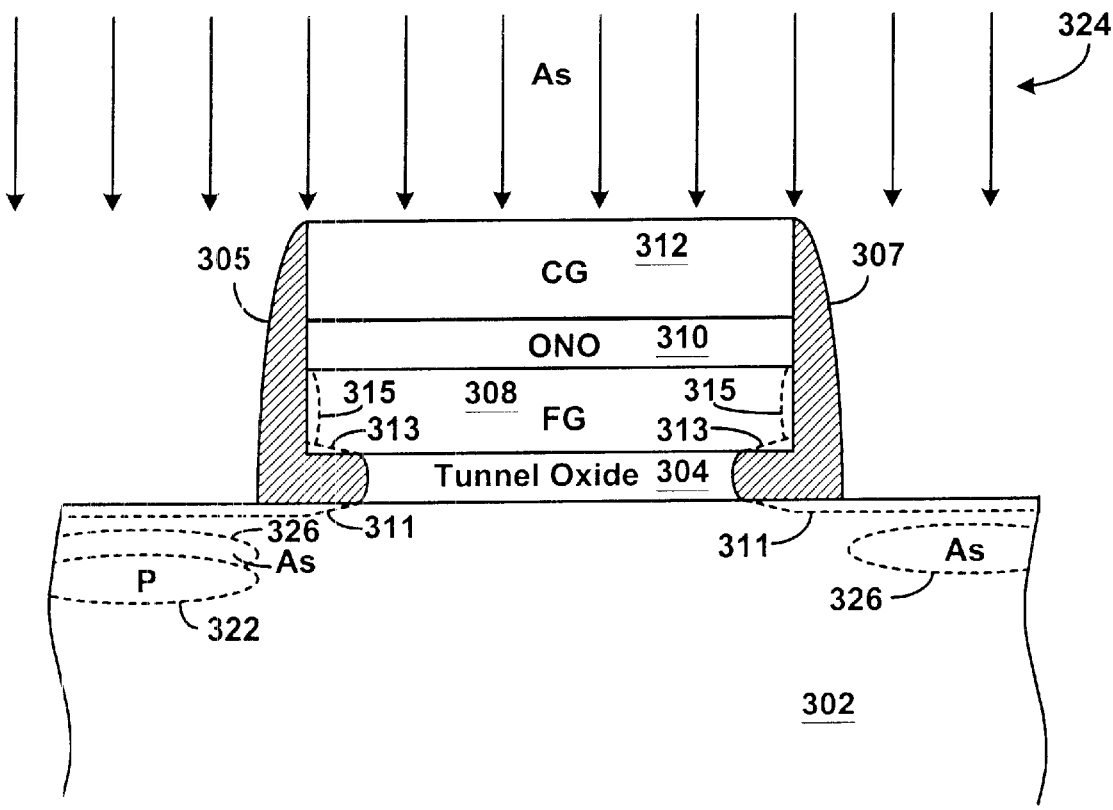

FIG. 3E shows the portion 300 of the flash memory device as shown in FIG. 3D being implanted with phosphorus (P) ions as indicated by arrows 319. A patterned mask layer 321 protects portions of the flash memory device that are not to receive phosphorus ions. The phosphorus ions are to form the phosphorus implanted region of the double diffused source region of the device. The phosphorus ions are implanted beneath the surface of the substrate 302 and initially are concentrated generally in a region indicated by the dashed shape 322. It is noted that the spacer 305 protects the ends of the control gate 312 and the floating gate 308 from damage that would be caused by the FIG. 3F shows the portion 300 of the flash memory device as shown in FIG. 3E with the mask layer 321 removed and being implanted with arsenic ions (As) as indicated by arrows 324. The arsenic ions are to form the arsenic implanted region of the double diffused source region and to form the drain region of the flash memory device. Like the phosphorus ions, the arsenic ions are implanted beneath the surface of the substrate 302 and initially are concentrated generally in regions indicated by the dashed shape 326. It is noted that the spacers 305 and 307 protect the ends of the control gate 312 and the floating gate 308 from damage that would be caused by the implantation of the arsenic ions. Like the phosphorus ions, the arsenic ions are implanted beneath the surface of the substrate 302 and initially are concentrated generally in regions indicated by the dashed shape 326. It is noted that the spacers 305 and 307 protects the ends of the control gate 312 and the floating gate 308 from damage that would be caused by the implantation of the arsenic ions.

Figure 3G:
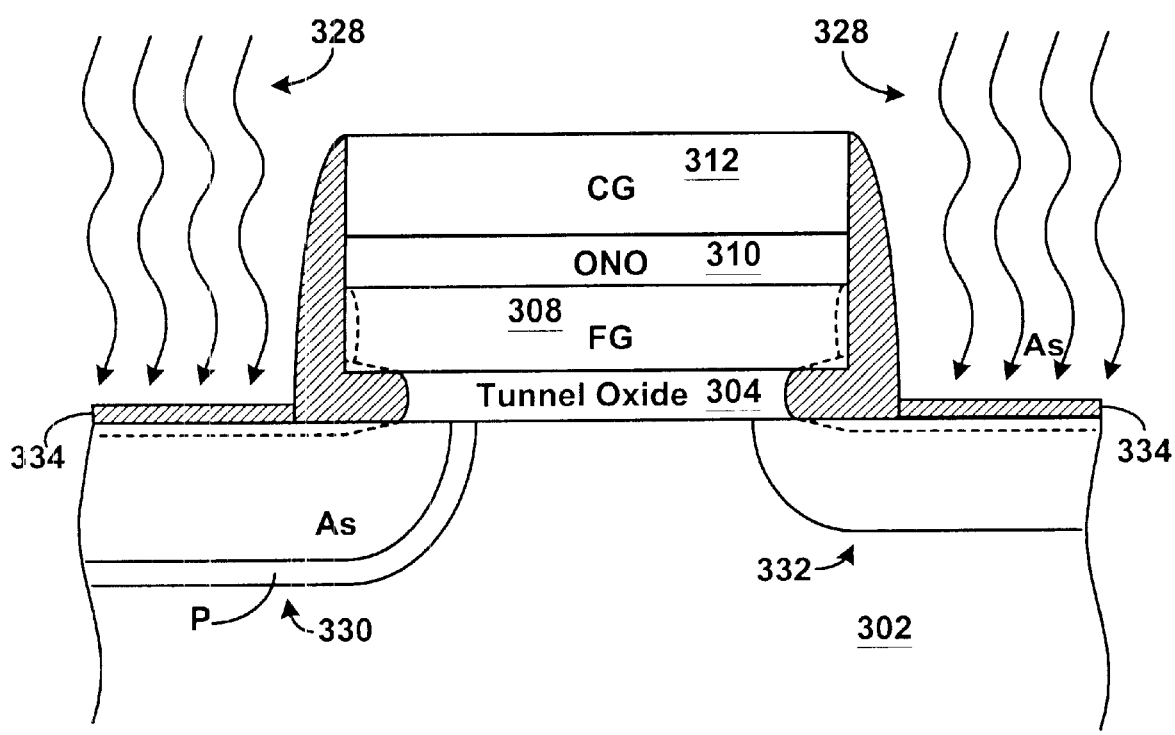

FIG. 3G shows the portion 300 of the flash memory device as shown in FIG. 3F undergoing an anneal procedure, indicated by the wavy arrows 328, the purpose of which is to drive the implanted arsenic ions and phosphorus ions into the substrate 302 to form the double diffused source region 330 and the drain region 332. The anneal procedure also repairs damage to the substrate caused by the implantation procedure. During the anneal procedure the oxide thickens as indicated at 334. The amount of gate-edge lifting is also affected but the amount of gate-edge lifting is less than that of the prior art methods and the amount of gate edge lifting can be controlled by controlling the thickness t as discussed above.

In summary, the present invention overcomes the limitations of the prior art and fulfills the need for a flash memory cell that has a predetermined amount of gate edge lifting.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a flash memory device with a predetermined amount of gate edge lifting, the method comprising:
   (a) forming a gate stack on a substrate wherein the gate stack includes a tunnel oxide formed on the substrate, a floating gate formed on the tunnel oxide, a layer of dielectric formed on the floating gate and a control gate formed on the layer of dielectric;
   (b) etching a portion of the tunnel oxide forming cavities at each end of the tunnel oxide;
   (c) depositing a layer of oxide on the gate stack and exposed portions of the substrate, wherein the oxide fills the cavities;

(d) etching the layer of oxide to form spacers on the sides of the gate stack, wherein the spacers have a thickness t.

2. The method of claim 1 wherein the thickness t is a predetermined thickness determined during a characterization procedure.

3. The method of claim 2 wherein the characterization procedure is selected from a computer modeling procedure and an empirical method.

4. The method of claim 3 further comprising (e) implanting phosphorus ions into the substrate to form a phosphorus implanted region of a double diff-used source region.

5. The method of claim 4 further comprising (f) implanting arsenic ions into the substrate to form an arsenic implanted region of the double diffused source region and to form an arsenic implanted drain region.

6. The method of claim 5 further comprising (g) a first anneal process to density and improve the quality of the deposited layer of oxide.

7. The method of claim 6 further comprising (h) a second anneal process to drive the implanted phosphorus ions and implanted arsenic ions into the substrate and to repair implant damage to the substrate.

* * * * *